United States Patent [19]

Chang

[11] Patent Number: 4,942,357
[45] Date of Patent: Jul. 17, 1990

[54] METHOD OF TESTING A CHARGE-COUPLED DEVICE

[75] Inventor: Win-Chyi Chang, Penfield, N.Y.

[73] Assignee: Eastman Kodak Company, Rochester, N.Y.

[21] Appl. No.: 390,210

[22] Filed: Aug. 7, 1989

[51] Int. Cl.$^5$ .................... G01R 31/26; G11C 29/00
[52] U.S. Cl. .................................. 324/158 R; 357/24
[58] Field of Search ........... 324/158 T, 158 D, 158 R; 357/24; 365/201; 371/21.4

[56] References Cited

U.S. PATENT DOCUMENTS

| | | | |
|---|---|---|---|
| 3,748,579 | 7/1973 | Henry et al. | 324/158 D |
| 3,750,018 | 7/1973 | Leone et al. | 324/158 T |
| 3,943,442 | 3/1976 | Fletcher et al. | 324/158 R |
| 3,995,216 | 11/1973 | Yun | 324/158 R |
| 4,196,389 | 4/1980 | Kelly et al. | 324/158 R |
| 4,382,229 | 5/1983 | Cottrell et al. | 324/158 T |
| 4,409,696 | 10/1983 | Varshney | 324/158 T |
| 4,412,343 | 10/1983 | Kosonocky | 357/24 |
| 4,509,012 | 4/1985 | Lin | 324/158 D |
| 4,567,430 | 1/1986 | Carr | 324/158 D |

FOREIGN PATENT DOCUMENTS 57-88367 6/1982 Japan .

*Primary Examiner*—Ernest F. Karlsen
*Attorney, Agent, or Firm*—Donald D. Schaper

[57] ABSTRACT

A method is disclosed for testing a charge-coupled device (CCD). A test device for use in the method includes a buried channel transistor which is formed adjacent the CCD. The source and drain of the transistor are located on opposite sides of the CCD. In the use of the test device to locate barriers and pockets in the CCD, clock voltages that are used in the operation of the CCD are applied to the gate electrodes of the CCD to simulate the transfer of charge from one phase to another. Predetermined voltages are then applied to the transistor, and the drain current and source voltage are measured in order to construct curves which indicate the existence and size of the barriers and pockets.

12 Claims, 4 Drawing Sheets

METHOD OF TESTING A CHARGE-COUPLED DEVICE

BACKGROUND OF THE INVENTION

1. Field of the Invention

This invention relates to a method of testing a charge coupled device (CCD), and more particularly, to a method of testing a CCD in order to detect manufacturing defects in the device.

2. Description of the Prior Art

In two phase CCD's, a common problem is the formation of barriers and pockets at the interface between the storage and transfer regions. These barriers and pockets trap charge and cause transfer inefficiency. The barriers and pockets are formed in the manufacturing process as a result of, for example, misalignment between an implanted region in the CCD and an overlying electrode.

A problem in the prior art has been that there is no method of testing a CCD during the manufacture of the devices to determine either the existence or the size of barriers and pockets in the CCD. Thus, it has been necessary to perform expensive manufacturing steps in order to complete the CCD so that it can be tested. In many cases, the CCD's must be discarded because of defects which should have been detected earlier in the manufacturing process.

SUMMARY OF THE INVENTION

It is an object of the present invention to overcome the problem in the prior art and to provide an improved method for testing for defects in a CCD.

In accordance with one aspect of the present invention, there is provided a method of testing CCD's to detect the size of barriers and pockets therein, the method comprising the steps of: forming a test device which includes a two phase CCD and a transistor having an source and a drain, a buried channel in the device being common to the CCD and the transistor; applying clock voltages to electrodes of the CCD to simulate the transfer of charge from one phase to another; applying predetermined voltages to the transistor; and measuring a source voltage and a drain current for each of the predetermined voltages to determine values thereof which indicate the existence and extent of the barriers and pockets.

In one embodiment of the present invention, there is disclosed a method of testing CCD's to detect the size of barriers therein, the method comprising the steps of: forming a test transistor adjacent two electrodes of a CCD, the transistor having a source adjacent one of the electrodes and a drain adjacent the other of the electrodes; applying clock voltages to the electrodes to simulate the transfer of charge from one phase to another; offsetting the drain voltage with respect to the source voltage and sweeping the two voltages together; obtaining values of drain current and source voltage during the sweep and constructing a first drain current versus source voltage curve from said values; maintaining the drain voltage fixed at a high voltage and sweeping the source voltage; obtaining a set of values for the drain current while sweeping the source voltage and constructing a second drain current versus source voltage curve from said set; and determining the difference in potential between points in the first and second curves where the drain current becomes zero, the difference being indicative of the barrier size.

In a second embodiment of the present invention, there is disclosed a method of testing CCD's to detect the size of pockets therein, the method comprising the steps of: forming a test transistor adjacent a two phase CCD which is adapted to transfer charge along an axis, the transistor having a source on one side of the CCD and a drain on an opposite thereof, the transistor being operable in a direction perpendicular to the axis; applying clock voltages to the electrodes of the CCD to simulate the transfer of charge from one phase to another; offsetting the drain voltage with respect to the source voltage and sweeping the two voltages together; measuring the drain current and source voltage during the sweep and constructing a drain current versus source voltage curve; and determining the difference in potential between a point in the curve where the drain current is zero and a point in said curve where there is a substantial increase in the slope of the curve, the difference representing the pocket size.

An advantage of the present invention is that the test structure can be easily formed during the manufacturing process. Since the same process is used to form both the test structure and the production elements, a very precise control can be maintained over the manufacturing process. A further advantage is that extent of a defect can be quantified, and thus, CCD's which fall beyond an acceptable limit can be eliminated without further processing.

Other features and advantages will become apparent upon reference to the following description of the preferred embodiment when read in light of the attached drawings.

DESCRIPTION OF THE PREFERRED EMBODIMENTS

Figure 1:
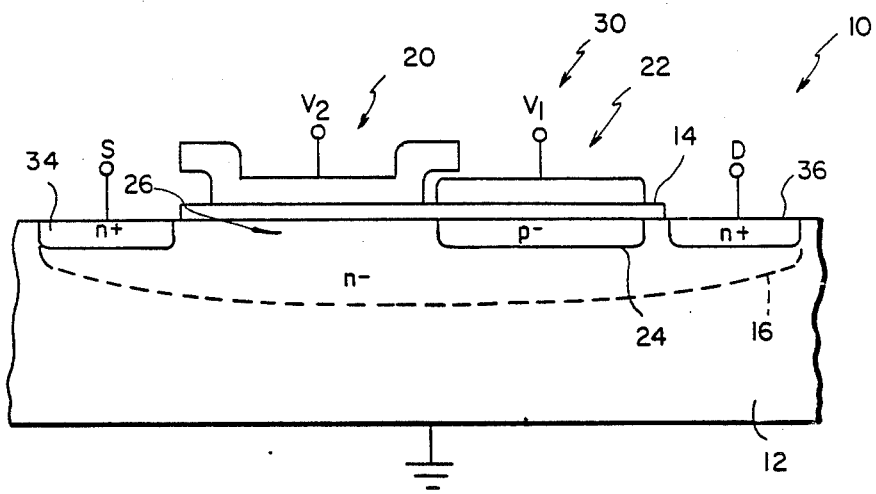
FIG. 1 is a sectional view of the test device of the present invention.
Figure 2:
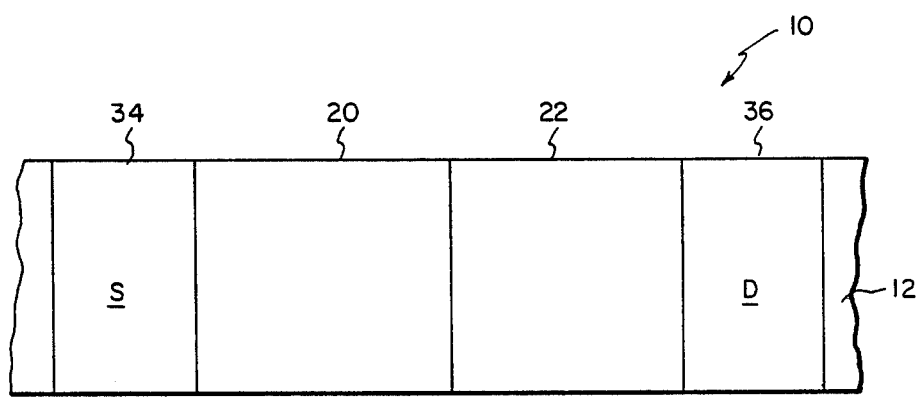
FIG. 2 is a plan view of the device shown in FIG. 1.

With reference to FIG. 1, there is shown a test device 10 which is constructed in accordance with the present invention. Test device 10 can be formed on a P-type substrate 12. An insulator layer 14 is formed on substrate 12, and a region under layer 14 is doped with an $n^-$ type dopant, for example, phosphorus or arsenic, to form a buried channel 16. Polysilicon gate electrodes 20 and 22 are formed on insulator layer 14. A p⁻ material, for example, boron, is implanted under electrode 22 to create a transfer region 24 adjacent a storage region 26. The gate electrodes 20 and 22, transfer region 24, storage region 26, and buried channel 16 form the structure of a CCD, designated 30. N+ regions are implanted in buried channel 16 in order to form a buried channel transistor having a source 34 and a drain 36. The n+ regions which form source 34 and drain 36 can be formed by implanting, for example, arsenic.

Test device 10 can be formed on any suitable substrate. However, in a preferred usage, device 10 would be formed on a wafer (not shown) on which CCD's are being fabricated, using the same masks and steps to form the all of the CCD's including CCD 30 in device 10. Thus, defects which are detected in the test device can be assumed to be in all of the CCD's on the wafer. If such defects are of a sufficient magnitude, the wafer can be discarded without further processing.

Figure 3:
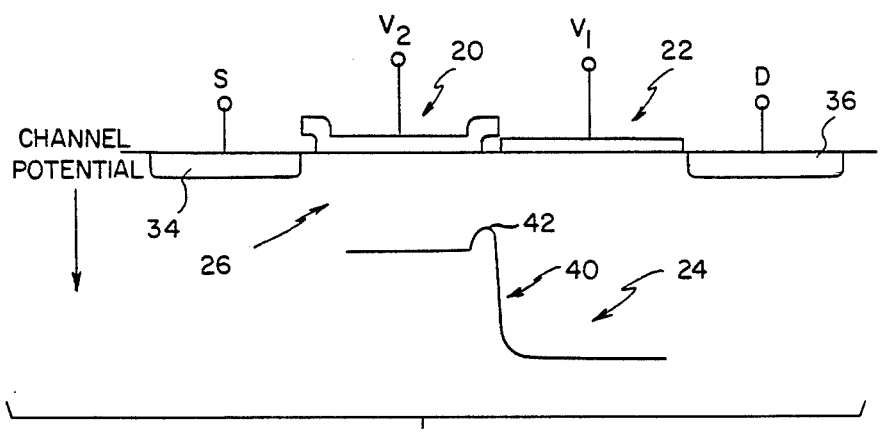
FIG. 3 is a partial sectional view of the test device and further including a potential diagram of the CCD which shows the location of a barrier between the the two phases.
Figure 4:
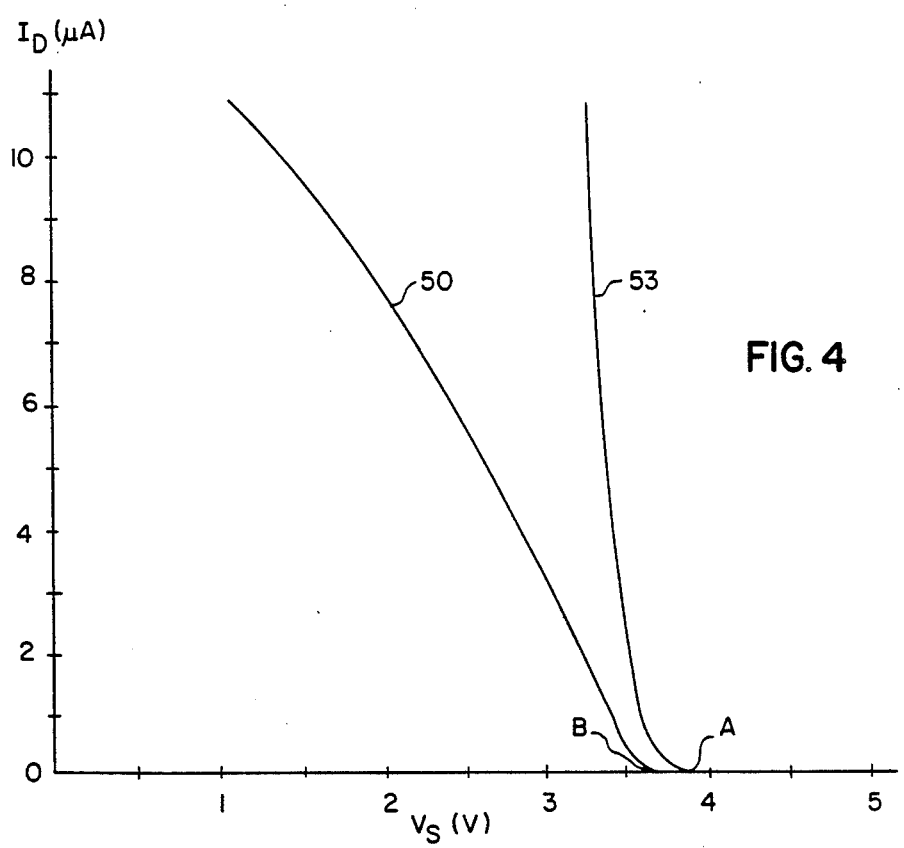
FIG. 4 show curves of drain current versus source voltage obtained in the determination of barriers in the CCD.

In performing the method of the present invention, test device 10 functions as a transistor. If a barrier, indicated at 42 in the potential profile 40 in FIG. 3, has been created in the manufacturing process, it can be located and the height thereof determined by the method disclosed herein. As will be apparent from the discussion that follows, the height of the barrier 42 will be indicated by the potential difference between points B and A in curves 50 and 52, respectively, shown in FIG. 4.

Figure 5:
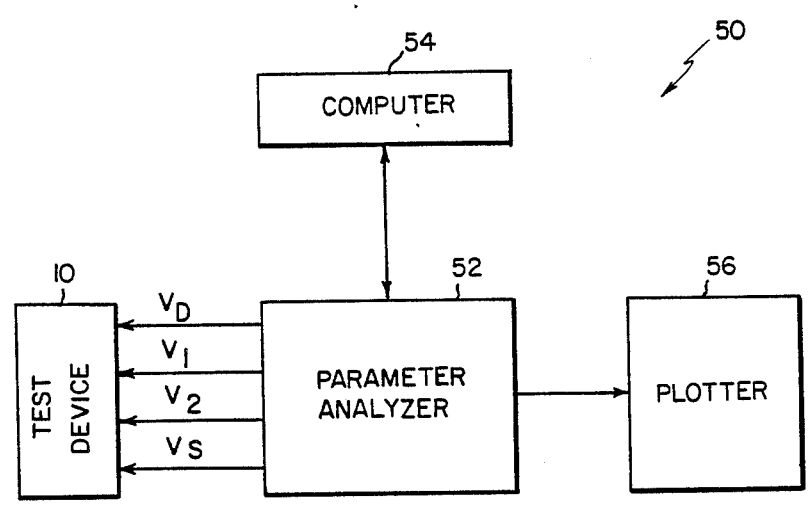
FIG. 5 is schematic diagram of the test apparatus which is used in performing the method of the present invention.

Apparatus 50, shown in FIG. 5, can be used in the disclosed method. Apparatus 50 comprises a parameter analyzer 52 which can be used to generate voltages to source 34 and drain 36, and voltages $V_1$, and $V_2$ to CCD 30. Analyzer 52 can also be used to monitor the current of drain 36. Parameter analyzer 52 can be, for example, a Hewlett Packard 4145 parameter analyzer. Parameter analyzer 52 is interfaced to a computer 54 to provide for automated testing. A plotter 56, connected to analyzer 52, is used to make the drain current versus source voltage curves shown in FIGS. 4 and 8.

In the use of test device 10 to find barriers 42, clock voltages $V_1$ and $V_2$, the voltages that are used in the operation of the CCD 30, are applied to device 10 to simulate the transfer of charge from one phase to another. In the next step, the drain voltage is offset by 100 mV with respect to the source voltage, and the two are swept together. The potential B is obtained from a drain current ($I_D$) vs source voltage ($V_D$) curve 50 shown in FIG. 4, and point B is the point where the drain current ($I_D$) becomes zero. In order to determine potential A, the drain voltage is fixed at a high voltage, for example 12 V. With the drain voltage fixed at 12 V, the source voltage is swept and values for the drain current ($I_D$) and source voltage ($V_S$) are recorded. A curve 52 is constructed from these values, and potential A, the potential at which $I_D$ becomes zero, is obtained from this curve. The difference between the potential at point A in curve 52 and the potential at point B in curve 50 is indicative of the barrier height. Thus, if the points A and B coincide, it can be assumed that no barrier exists.

Figure 6:
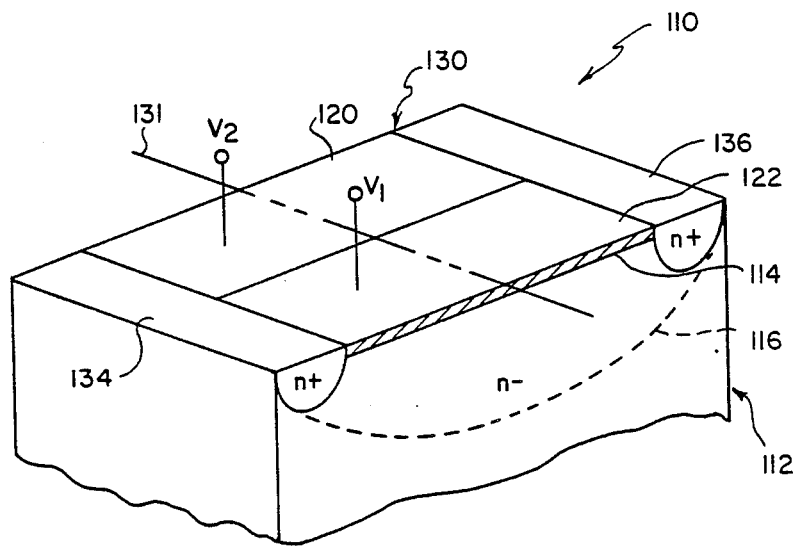
FIG. 6 is perspective view of a second embodiment of a test device used in the present invention.
Figure 7:
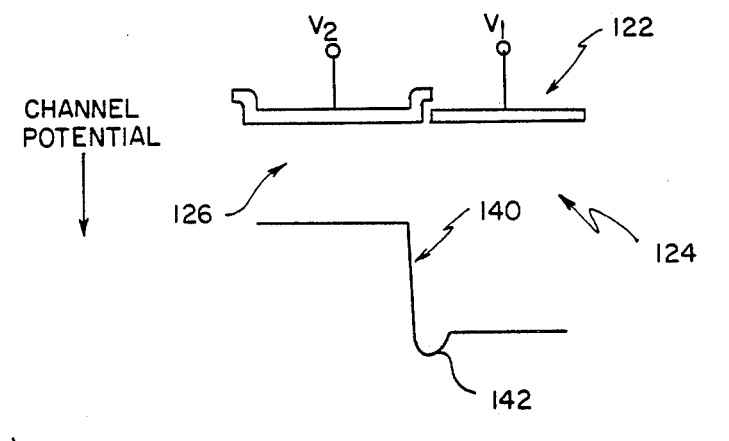
FIG. 7 is a diagram showing a potential profile of the CCD in the device shown in FIG. 6 and further showing the location of a pocket between the two phases of the CCD.
Figure 8:
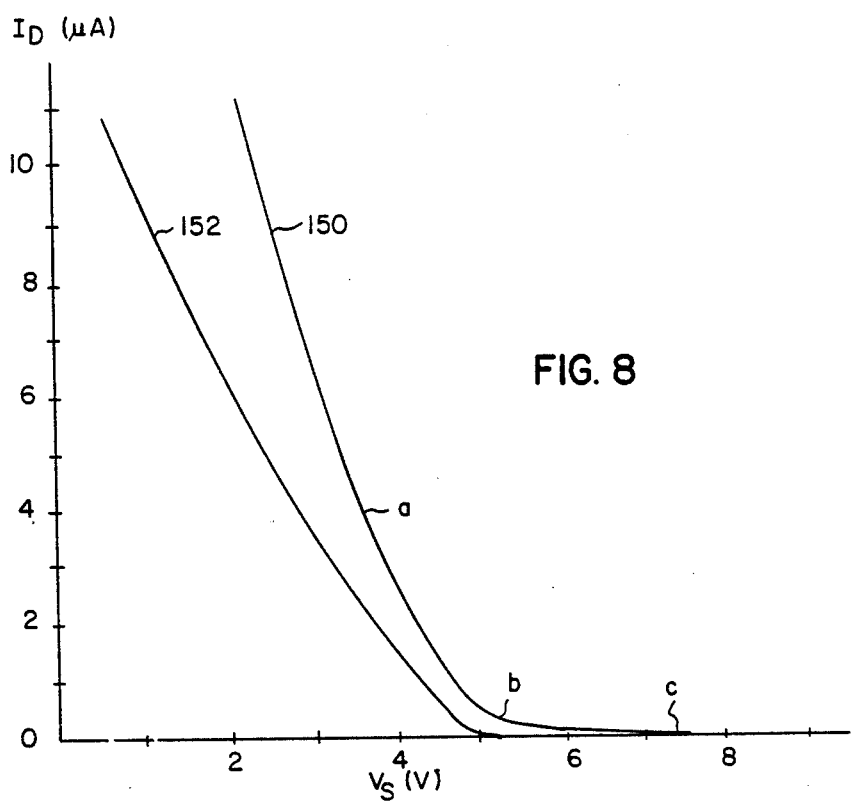
FIG. 8 shows curves of drain current versus source voltage obtained in the determination of pockets in a CCD.

With reference to FIGS. 6-8, there is shown a test device 110 which is constructed in accordance with a second embodiment of the present invention. Test device 110 can be formed on a p type substrate 112. An insulator layer 114 is formed on substrate 112, and a region under layer 114 is doped with an n⁻ type dopant, for example phosphorus or arsenic, to form a buried channel 116. Polysilicon gate electrodes 120 and 122 are formed on insulator layer 114. A p⁻ material, for example boron, is implanted under electrode 122 to create a transfer region 124 (FIG. 7) adjacent a storage region 126 under electrode 120. The gate electrodes 120 and 122, the transfer region 124, the storage region 126, and buried channel 16 form the structure of a two-phase CCD 130 which can transfer charge along an axis 131. N+ regions are formed by implanting, for example, arsenic, in buried channel 16 to form a buried channel transistor having a source 134 and a drain 136; the transistor is operable in a direction perpendicular to the axis 131.

Apparatus 50 is also used with device 110 to perform the method of the present invention. In FIG. 7, there is shown a potential profile 140 for the two phases of CCD 130. If a pocket, indicated at 142 in the potential profile 140, has been created in the manufacturing process, it can be located and the depth thereof determined in accordance with the method disclosed herein.

In the use of test device 110, clock voltages $V_1$ and $V_2$ are applied to device 110 to simulate the transfer of charge from one phase to another. In a next step, the voltage to drain 136 is offset by 100 mV with respect to the voltage to source 134, and the two are swept together to obtain a set of values for drain current ($I_D$) and for source voltage ($V_S$). A curve 150, shown in FIG. 8, is then constructed from these values. In curve 150, the potential difference between points c and b is indicative of the depth of a pocket 142. Between points c and b, current is flowing only in the pocket 142, and between point b and a point a, current is flowing in pocket 142 and in the transfer region 142. In the part of the curve above point a, current is flowing in pocket 142 and in both the transfer region 124 and the storage region 126. A second curve 152 is shown to illustrate the curve which would be obtained if no pocket 142 exists in the test device 110.

The invention has been described in detail with particular reference to the preferred embodiment thereof, but it will be understood that variations and modifications can be effected within the spirit and scope of the invention.

I claim:

1. A method of testing CCD's to detect the size of barriers and pockets therein, said method comprising the steps of:

test device which includes a forming a two-phase CCD and a transistor having an source and a drain, a buried channel in said device being common to said CCD and said transistor;

applying clock voltages to electrodes of said CCD to simulate the transfer of charge from one phase to another;

applying predetermined voltages to said transistor; and measuring a source voltage and a drain current for each of said predetermined voltages to determine values thereof which indicate the existence and extent of said barriers and pockets.

2. A method, as defined in claim 1, wherein said CCD is disposed to move charge carriers along a first axis, and said source and said drain formed along said axis.

3. A method, as defined in claim 2, wherein in applying predetermined voltages to the transistor the drain voltage is offset by about 100 mv with respect to the source voltage and the two voltages are swept together.

4. A method, as defined in claim 3, wherein a curve is constructed from drain currents and source voltages measured during the sweep of said two voltages.

5. A method, as defined in claim 4, wherein in a further application of the predetermined voltages the drain voltage is maintained fixed at a high voltage while sweeping the source voltage.

6. A method, as defined in claim 5, wherein a curve is constructed from the drain currents and the source voltages obtained while sweeping the source voltage, and the difference in potential between said curves when the drain current is zero is indicative of the height of a barrier in said CCD.

7. A method, as defined in claim 1, wherein said CCD is adapted to move charge along a first axis, and said source and drain are formed along an axis perpendicular to said first axis.

8. A method, as defined in claim 7, wherein in applying predetermined voltages to the transistor the drain voltage is offset by about 100 mv with respect to the source voltage and the two voltages are swept together.

9. A method, as defined in claim 8, wherein the depth of a pocket is determined by measuring the difference in potential between a point in said curve where the drain current is zero and a point in the curve where there is a substantial increase in the slope of the curve.

10. A method of testing CCD's to detect the size of barriers therein, said method comprising the steps of:
forming a test transistor adjacent two electrodes of a CCD, said transistor having a source adjacent one of said electrodes and a drain adjacent the other of the electrodes;
applying clock voltages to the electrodes to simulate the transfer of charge from one phase to another;
offsetting the drain voltage with respect to the source voltage and sweeping the two voltages together;
obtaining values of drain current and source voltage during said sweep and constructing a first drain current versus source voltage curve from said values;
maintaining the drain voltage fixed at a high voltage and sweeping the source voltage;
obtaining a set of values for the drain current while sweeping the source voltage and constructing a second drain current versus source voltage curve; and
determining the difference in potential between points in the first and second curves where the drain current becomes zero, said difference being indicative of the barrier size.

11. A method, as defined in claim 10, wherein said CCD's are arranged to move charge carriers along a first axis and said source and said drain are formed along said axis.

12. A method of testing CCD's to detect the size of pockets therein, said method comprising the steps of:
forming a test transistor adjacent a two-phase CCD which is adapted to transfer charge along an axis, said transistor having a source on one side of said CCD and a drain on an opposite side thereof, said transistor being operable in a direction perpendicular to said axis;
applying clock voltages to the electrodes of said CCD to simulate the transfer of charge from one phase to another;
offsetting the drain voltage with respect to the source voltage and sweeping the two voltages together;
measuring the drain current and source voltage during said sweep and constructing a drain current versus source voltage curve; and
determining the difference in potential between a point in said curve where said drain current is zero and a point in said curve where there is a substantial increase in the slope of the curve, said difference representing the pocket size.

* * * * *

UNITED STATES PATENT AND TRADEMARK OFFICE
CERTIFICATE OF CORRECTION

PATENT NO. : 4,942,357
DATED : July 17, 1990
INVENTOR(S) : Win-Chyi Chang

It is certified that error appears in the above-identified patent and that said Letters Patent is hereby corrected as shown below:

Column 1, line 41, "an" should read -- a --.
Column 2, line 9, after "opposite", insert -- side --.
Column 3, line 15, delete "the" (first occurrence);
  line 28, "52" should read -- 53 --; line 53, "52" should read -- 53 --; and line 57, "52" should read -- 53 --.
Column 4, line 30, delete "a" (first occurrence); line 31, "142" should read -- 124 --; line 46, "test device which includes a forming a" should read -- forming a test device which includes a --; line 47, "an" should read -- a --; and line 61, after "drain, insert -- are --.

Signed and Sealed this

Seventh Day of January, 1992

Attest:

HARRY F. MANBECK, JR.

*Attesting Officer*  *Commissioner of Patents and Trademarks*